United States Patent [19]

Scavuzzo

[11] 4,386,282
[45] May 31, 1983

[54] EMITTER FUNCTION LOGIC (EFL) SHIFT REGISTER

[75] Inventor: Robert J. Scavuzzo, Springfield Township, Bucks County, Pa.

[73] Assignee: Bell Telephone Laboratories, Incorporated, Murray Hill, N.J.

[21] Appl. No.: 191,393

[22] Filed: Sep. 29, 1980

[51] Int. Cl.³ .................. H03K 3/289; H03K 3/35; H03K 19/086
[52] U.S. Cl. .................. 377/81; 307/272 A; 307/455; 307/467
[58] Field of Search ....... 307/221 R, 272 A, 454–455, 307/466–467, 222 R, 299 A

[56] References Cited

U.S. PATENT DOCUMENTS 4,145,623 3/1979 Doucette .................. 307/467 X

OTHER PUBLICATIONS

Kane, "A Low-Power, Bipolar, Two's Complement Serial Pipeline Multiplier Chip," *IEEE Journal of Solid-State Circuits,* vol. SC-11, No. 5, Oct. 1976, pp. 669–678.

Primary Examiner—Larry N. Anagnos
Assistant Examiner—David R. Hudspeth
Attorney, Agent, or Firm—Irwin Ostroff

[57] ABSTRACT

Solid-state shift register circuits, which have right and left shift capability and asynchronous set and clear, and asynchronous and synchronous parallel load capability are formed using a modified form of emitter function logic. These multicontrol shift register circuits achieve relatively high speed operation and have relatively low power dissipation, while requiring only a modest amount of silicon for implementation.

12 Claims, 3 Drawing Figures

EMITTER FUNCTION LOGIC (EFL) SHIFT REGISTER

TECHNICAL FIELD

This invention relates to current mode logic circuits, and more particularly to shift register circuits formed using modified Emitter Function Logic (EFL) circuits and other circuits.

BACKGROUND OF THE INVENTION

Many of today's solid-state shift register circuits use multilevel emitter-coupled logic circuits to achieve high speed operation while limiting power dissipation. Some of these shift registers incorporate set and clear functions within the emitter-coupled logic circuitry. To achieve right-left shift and synchronous and asynchronous parallel loading has generally required the use of multiple separate logic gates which decrease speed and increase power dissipation and the area of silicon necessary to implement the shift register and the gates.

The publication entitled "A Low-Power, Bipolar, Two's Complement Serial Pipeline Multiplier Chip" by Jack Kane, IEEE Journal of Solid-State Circuits, Vol. SC-11, No. 5, October 1976, pages 669–678, illustrates a D-type master-slave flip-flop which illustrates a combination of EFL and emitter-coupled stages. This configuration has relatively high speed and only moderate power dissipation. Multicontrol shift registers using this type of flip-flop are not known.

It is desirable to have a multicontrol solid-state shift register circuit which utilizes EFL and has relatively high speed operation, modest power dissipation, and can be implemented in a relatively modest area of silicon.

SUMMARY OF THE INVENTION

The invention is directed to a shift register circuit comprising a plurality of cascaded stages. Each stage has a master circuit comprising an EFL-type master storage cell having input and output terminals and comprising a plurality of control terminals and output terminals, first master control circuit means responsive to a plurality of input signals for controlling output terminals thereof, second control circuit means responsive to a plurality of input signals for controlling output terminals thereof, and third master control circuit means responsive to a plurality of input signals for controlling output terminals thereof. In addition, each stage has a slave circuit comprising an EFL-type slave storage cell having input and output terminals comprising a plurality of control terminals and output terminals, and first slave control circuit means responsive to a plurality of input signals for controlling output terminals thereof. An output terminal of a master circuit is coupled to an input terminal of a slave circuit. An output terminal of a stage is coupled to an input terminal of a subsequent stage, if a subsequent stage exists, and to an input terminal of a preceding stage, if a preceding stage exists. First and second output terminals of the first master control circuit means are coupled to a first output terminal of the second master control circuit means and to a first output terminal of the third master control circuit means, respectively. A second output terminal of the second master control circuit means is coupled to a first control terminal of the master storage cell. A second output terminal of the third master control circuit means is coupled to a second control terminal of the master storage cell. First and second output terminals of the first slave control circuit means are coupled to first and second control terminals of the slave storage cell, respectively.

In a preferred embodiment the shift register circuit further includes a second slave control circuit means responsive to a plurality of input signals for controlling output terminals thereof, and being coupled by a first output terminal to a first output terminal of the first slave control circuit means and being coupled by a second output terminal thereof to the first control terminal of the slave storage cell. In this embodiment, the master and slave storage cells each comprise a resistor and two multiple emitter junction transistors and the master and control circuit means each comprise a multi-transistor emitter-coupled differential amplifier. The first master and slave control circuit means also each comprise an essentially constant current source.

Another aspect of the invention is directed to a circuit which is essentially just one stage of the shift register circuit described above.

Still another aspect of the invention is directed to a circuit which is essentially just a master circuit of one stage of the shift register described above.

The above-described preferred shift register circuit has right and left shift capability and asynchronous set and clear, and asynchronous or synchronous parallel load capability.

These and other features and advantages of the invention are better understood from a consideration of the following description taken in conjunction with the accompanying drawings.

DETAILED DESCRIPTION

Figure 1:
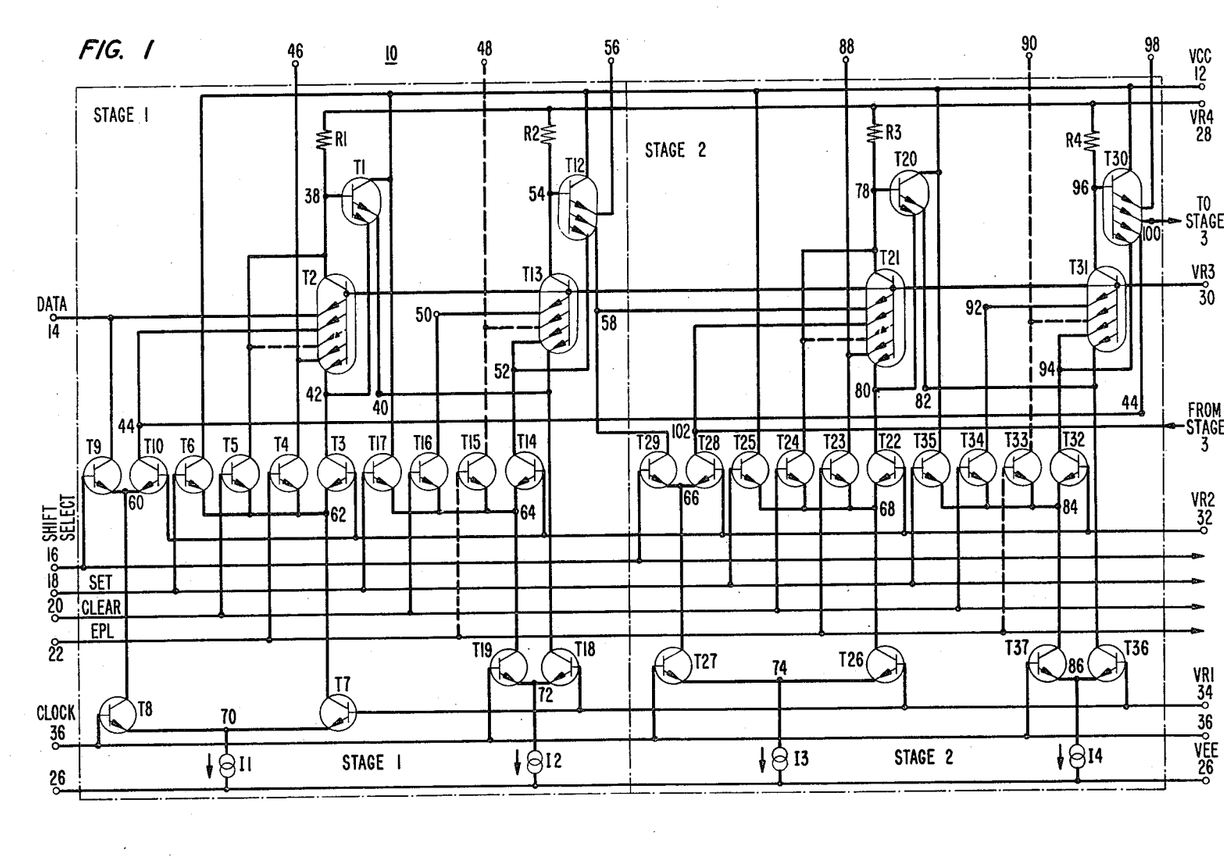
FIG. 1 illustrates one embodiment of a shift register circuit in accordance with the invention.

Referring now to FIG. 1, there is illustrated a shift register circuit 10 which comprises first and second circuit stages (stage 1 and stage 2) which are illustrated within dashed line rectangles. Each stage comprises a D-type master-slave flip-flop implemented using modified emitter function logic (EFL) which has been so designed as to incorporate circuitry which facilitates multiple control functions without incurring any additional shift register power dissipation and with only modest detriment to the speed of operation and to the area of silicon needed for implementation. Shift register circuit 10 is designed to allow data to be shifted from right to left or from left to right, to allow all outputs to be asynchronously set to logical ones ("1s") or to be asynchronously cleared to logical zeros ("0s") or to be synchronously or asynchronously parallel loaded.

Whereas only two stages of shift register circuit 10 are illustrated, it is to be understood that any number of additional stages can be used as are needed for any particular application.

Stage 1 comprises essentially two EFL circuits which are coupled together to form a D-type master-slave flip-flop. The first EFL circuit, the master (which may be referred to as a latch circuit), comprises n-p-n transistors T1, T2, T3, T4, T5, T6, T7, T8, T9, and T10, resistor R1, and essentially constant current source I1. The combination of R1, T1, and T2 may be referred to as an EFL-type master storage cell. The second EFL circuit, the slave (which may be referred to as a latch circuit), comprises n-p-n transistors T12, T13, T14, T15, T16, T17, T18, and T19, resistor R2, and essentially constant current source I2. The combination of R2, T12, and T13 may be referred to as an EFL-type slave storage cell. T1 has two emitters and T2 has four emitters. In an alternate embodiment, T2 has five emitters with the fifth shown with a dashed line.

A data input terminal 14 is coupled to the first emitter of T2 and to the collector of T9. Terminal 14 serves as a data input terminal of stage 1 and is coupled to one input terminal of the master of stage 1. The base of T9 is coupled to a shift select terminal 16 which controls whether digital information is shifted from left to right (i.e., from stage 1 to stage 2) or from right to left (i.e., from stage 2 to stage 1). Terminal 16 is also coupled to the base of n-p-n transisor T29 of stage 2. The second emitter of T2 is coupled to the collector of T10, a terminal 44, and to a third emitter of the four-emitter n-p-n transistor T30 of stage 2. The emitters of T9 and T10 are coupled to the collector of T8 and to a terminal 60. The bases of T3, T10, and T14 are coupled together to a terminal 32 and to a voltage reference source VR2. The bases of n-p-n transistors T22, T28, and T32, all of stage 2, are also coupled to terminal 32.

The emitters of T3, T4, T5, and T6 are coupled to the collector of T7 and to a terminal 62. The collector of T3 is coupled to the fourth emitter of T2, the second emitter of T1, and to a terminal 42. The collector of T4 is coupled to the third emitter of T2 and to a parallel load input terminal 46. The collectors of T2 and T5 are coupled together and are coupled to the base of T1, a first terminal of R1, and to a terminal 38. In an alternate embodiment, the collector of T5 is coupled to the fifth emitter of T2 and not to the collector of T2. This alternate connection is illustrated by the dashed line. The collectors of T6, T1, T17, and T12 are coupled to a terminal 12 and to a power supply VCC. The n-p-n transistors T25, T20, T30, and T35 of stage 2 also have their collectors coupled to terminal 12.

The bases of T6 and T17 are coupled to a set terminal 18. The bases of n-p-n transistors T25 and T35 of stage 2 are also coupled to set terminal 18. The bases of T5 and T16 are both coupled to a clear terminal 20. The bases of n-p-n transistors T24 and T34 of stage 2 are also coupled to terminal 20. The base of T4 is coupled to enable parallel load (EPL) terminal 22. The base of n-p-n transistor T23 of stage 2 is also coupled to terminal 22.

The n-p-n transistor T15 of stage 1 is illustrated in dashed lines to indicate that it is optional. Likewise, n-p-n transistor T33 of stage 2 is illustrated in dashed lines to indicate that it is also optional. When these transistors are not utilized, shift register circuit 10 is a synchronous parallel load type shift register. When both are used, shift register circuit 10 is an asynchronous parallel load type shift register. In the case in which T15 and T33 are used, their bases are coupled to terminal 22. In such case, the emitter of T15 is coupled to the emitters of T14, T16, and T17, to the collector of T19, and to a terminal 64. The collector of T15 is coupled to the second emitter of T13 and to a parallel load input terminal 48.

The collector of T16 is coupled to the first emitter of T13 and to a terminal 50. The collector of T14 is coupled to the third emitter of T13, the third emitter of T12, and to a terminal 52. The first emitter of T1 is coupled to the fourth emitter of T13, the collector of T18, and to terminal 40 which serves as an output terminal of the master of stage 1 and as an input terminal of the slave of stage 1.

A second terminal of R1 is coupled to a second terminal of R2, to a terminal 28, and to a voltage reference source VR4. Second terminals of resistors R3 and R4 of stage 2 are also coupled to terminal 28. A first terminal of R2 is coupled to the base of T12, the collector of T13, and to a terminal 54. The first emitter of T12 is coupled to a terminal 56 which serves as one output terminal of stage 1. The second emitter of T12, which also serves as another output terminal of stage 1, is coupled to the collector of n-p-n transistor T29, the first emitter of n-p-n transistor T21, all of stage 2, and to a terminal 58.

The bases of T2 and T13 are coupled together to a terminal 30 and to a reference voltage source VR3. The bases of n-p-n transistors T21 and T31 of stage 2 are also coupled to terminal 30.

The bases of T8 and T19 are coupled together to a clock terminal 36. The bases of n-p-n transistors T27 and T37 of stage 2 are also coupled to clock terminal 36. The bases of T7 and T18 are coupled to a terminal 34 and to a voltage reference source VR1. The bases of n-p-n transistors T26 and T36 of stage 2 are also coupled to terminal 34.

The emitters of T7 and T8 are coupled together to one terminal of essentially constant current source I1 and to a terminal 70. The emitters of T18 and T19 are coupled together to a first terminal of a second essentially constant current source I2 and to a terminal 72. The second terminals of I1 and I2 are coupled together to a power supply VEE and to a terminal 26.

Stage 2 comprises essentially two EFL circuits which are coupled together to form a D-type master-slave flip-flop. The first EFL circuit, the master, comprises n-p-n transistors T20, T21, T22, T23, T24, T25, T26, T27, T28, and T29, resistor R3, and essentially constant current source I3. T20 has two emitters and T21 is a four-emitter transistor in one embodiment and a five-emitter transistor in another embodiment. The second EFL circuit, the slave, comprises essentially n-p-n transistors T30, T31, T32, T33, T34, T35, T36, and T37, resistor R4, and essentially constant current source I4. T30 and T31 both have four emitters each. The second terminals of I3 and I4 are coupled to terminal 26. A first terminal of I3 is coupled to a terminal 74 and to the emitters of T26 and T27. A first terminal of I4 is coupled to a terminal 86 and to the emitters of T36 and T37. The emitters of T28 and T29 are coupled together to the collector of T27 and to a terminal 66. The emitters of T22, T23, T24, and T25 are coupled together to the collector of T26 and to a terminal 68. The emitters of T32, T33 (when used), T34, and T35 are coupled together to the collector of T37 and to a terminal 84. The collector of T32 is coupled to the fourth emitter of T30, the third emitter of T31, and to a terminal 94. The collector of T33 (when used) is coupled to the second emitter of T31 and to a parallel load input terminal 90. The collector of T34 is coupled to the first emitter of T31 and to a terminal 92. The collector of T36 is coupled to the fourth emitter of T31, a first emitter of T20, and to a terminal 82 which serves as an output terminal of the master of stage 2 and as an input terminal of the slave of stage 2.

The second emitter of T20 is coupled to the fourth emitter of T21, the collector of T22, and to a terminal 80. The base of T20 is coupled to a first terminal of R3, the collector of T21, the collector of T24, and to a terminal 78. In another embodiment, the collector of T24 is coupled to the fifth emitter of T21 and not to terminal 78. The second emitter of T21 is coupled to the collector of T28 and to a terminal 102. Terminal 102 is connected to an output of the slave of a third stage (not illustrated) if such a stage is used. The collector of T23 is coupled to the third emitter of T21 and to a parallel load input terminal 88. The base of T30 is coupled to a first terminal of R4, the collector of T31, and to a terminal 96. The first emitter of T30 is coupled to an output terminal 98 of stage 2. The second emitter of T30 is coupled to a second output terminal 100. Terminal 100 is adapted to be coupled to an input terminal of a third stage (not illustrated) if same is used. The second emitter of T30 and terminal 100 can be eliminated if only a two stage shift register is needed.

R1 is chosen in conjunction with essentially constant current source I1 to provide a nominally one VBE voltage drop or less (typically 0.6 to 1.0 VBE) across pull-up R1 when current equal to the magnitude drawn by I1 is flowing through it. Thus the voltage at the base of T1 varies between an essentially zero voltage drop with respect to VR4 and a voltage equal to one VBE below VR4. Consequently, the voltage at the first emitter of T1, and the voltage at output terminal 40, varies between one VBE less than VR4 and 1.5 VBE less than VR4. These two voltage levels form the standard logic signal levels between EFL logic gates. Elementary arithmetic will show that these logic voltage levels are one-half VBE more positive and one-half VBE less positive than VR2. R2 and I2, R3 and I3, and R4 and I4 are chosen to provide similar potentials at the bases and emitters of the corresponding transistors they are coupled to or through.

VR1, VR2, VR3, and VR4 are all well regulated with respect to each other. If a positive supply voltage is used, such as VCC=5 volts±10%, with VEE at ground potential, then in the preferred embodiment, VR1 is chosen to be 1.5 VBE above ground. Since one VBE equals approximately 0.8 volts at room temperature, VR1 equals approximately 1.2 volts; VR2 (2.5 VBE) equals approximately 2.0 volts; VR3 (3.5 VBE) equals approximately 2.8 volts; and VR4 (4 VBE) equals approximately 3.2 volts. Supply voltage variations and temperature variations are absorbed by the difference between VCC and VR4.

If a negative supply voltage is used, such as VEE=−5.2 volts, and VCC is ground, then VCC and VR4 would be connected together. VR3 would be −0.5 VBE which is approximately −0.4 volts. Similarly VR2 (−1.5 VBE) would equal approximately −1.2 volts and VR1 (−2.5 VBE) would equal approximately −2.0 volts. In this configuration, voltage supply variations and temperature effects on the bias voltages would be absorbed by the constant current source I1.

The operation of shift register circuit 10 is easily understood by first reviewing the operation of stage 1.
Starting with the following conditions:
Shift select terminal 16="1" (a high logic level);
Set terminal 18=Clear terminal 20=EPL terminal 22="0" (a low logic level); and
Clock terminal 36="1"

For these conditions T8 and T9 are on and T7 and T10 are off. If the input signal applied to data terminal 14 is a "1", then no current flows from the first emitter of T2 since VR3 is of insufficient potential to sufficiently forward-bias the base of T2 to allow conduction therethrough. Thus I1 flows from a source (not illustrated) coupled to terminal 14 and does not flow through R1. This leaves terminal 38 at essentially the potential of VR4, a logic "1" or a high level. Accordingly, terminal 40, the output of the master of stage 1 is also at a "1" level. If data terminal 14 is a "0", then the first emitter-base junction of T2 is forward-biased and I1 flows from VR4 through R1, T2, T9, and T8. This current flow drops the potential of terminal 38 to a low level, a "0", and consequently the potential of terminal 40 is a "0".

Thus with the above-stated conditions, the output of the master at terminal 40 is at the same logic state as is applied to data terminal 14.

For these same conditions, T19 and T14 are on and T15, T16, T17, and T18 are off. If prior to this point in time the third emitters of T12 and T13 (terminal 52) are at a "1" state, then T13 is off and, consequently, current I2 flows through T12 and not through T13. This causes terminal 54 to stay at a high level since there is essentially no current flow through R2. Thus, the output at the emitters of T12 (terminals 52, 56, and 58) is high at this point in time, and is maintained at the high ("1") state.

If the output terminals 52, 56, and 58 of T12 were low ("0") at the time when the clock went from a "0" level to a "1" level, then T13 turns on and keeps terminal 54 at a low ("0") level such that the output terminals 52, 56, and 58 of T12 remain at "0s". Thus, output terminals 52, 56, and 58 of T12 are latched to whatever state they were in prior to clock terminal 36 going from a "0" to a "1".

For the same conditions that exist above, except with clock terminal 36 at a "0" level, T7 and T3 are on and T8, T4, T5, and T6 are off. If terminal 42 had been at a high level, a "1", when the clock went from a "1" to a "0", then conduction occurs through T1 and not through T2. This maintains terminal 38 at a "1" and, therefore, terminals 40 and 42 are maintained at logic "1s". It is to be noted that at this time data terminal 14 can be switched to a "1" or a "0", but that output terminal 40 stays latched at a "1". With output terminal 40 at a "0" when the clock goes from a "1" to a "0", conduction occurs through T2 and the corresponding voltage drop across R1 insures that the current flow continues through T2. This insures that output terminal 40 is latched to a "0". At this time data terminal 14 can be switched to a "1" or a "0" and still terminal 40 stays at a "0".

Accordingly, when the clock terminal 36 is switched from a "1" to a "0", output terminal 40 is latched to whatever state it had just prior to the time the clock went from a "1" to a "0".

If clock terminal 36 is at a "0" level and terminal 40 is at a "1" level, then the fourth emitter-base junction of T13 is held off and current I2 flows through T1. Consequently, current I2 is not supplied through R2 and T13 and, thus, output terminals 52, 56, and 58 of T12 are at "1" levels. If clock terminal 36 is a "0" and terminal 40 is a "0", then the fourth emitter-base junction of T13 is forward-biased and T13 conducts such that I2 flows through R2 and lowers the potential of terminal 54 to a "0". Thus output terminals 52, 56, and 58 of T12 are also at a "0" level.

Accordingly, when the clock signal goes from a "1" to a "0" level, output terminal 40 (the output of the master) controls the output state of the slave (terminals 52, 56, and 58). The output of the slave of each stage is the output of that stage. When terminal 40 is a "1", terminals 52, 56, and 58 are at "1s", and when terminal 40 is at a "0", terminals 52, 56, and 58 are "0s".

The logic state of shift select terminal 16 determines if data is shifted from stage 1 to stage 2 (information shifts from left to right) or from stage 2 to stage 1 (information shifts from right to left). Assuming that shift select terminal 16="1", set terminal 18=clear terminal 20=EPL terminal 22="0", and clock terminal 36="1", then within stage 1, T8 and T9 are on and T7 and T10 are off and within stage 2, T27 and T29 are on and T26 and T28 are off. Accordingly, logic information applied to data terminal 14 controls the master of stage 1 since terminal 44 has no current path to VEE and, thus, does not affect the logic state of the master. Logic information from output terminal 58 of stage 1 can control conduction through T21 of stage 2 since current can flow from T12 through T29 and T27. Terminal 102, which is coupled to an output of the slave of stage 3, if stage 3 is used, has no current path to VEE and, thus, does not affect the logic state of the master. Thus, if a third stage is used, the output data from same does not control the master of stage 2 which is controlled by the data at the output of stage 1. Accordingly, logic information shifts from left to right.

With shift terminal 16="0", set terminal 18=clear terminal 20=EPL terminal 22="0", and clock terminal 36="1", then within stage 1, T8 and T10 are on and T7 and T9 are off, and within stage 2, T27 and T28 are on and T26 and T29 are off. Data terminal 14 does not affect the state of the master of stage 1 since there is no current path available from terminal 14 through T9 and T8 to VEE. Terminal 44, one output terminal of stage 2, has a current path through T8 and T10 available and, accordingly, logic information from stage 2 acts as the data input signal to stage 1. Output terminal 58 does not affect the state of the master of stage 2 since there is no current path from T12 through T29 and T27 to VEE. Logic information from stage 3 (not illustrated) acts as the data input signal to input terminal 102 of stage 2. Accordingly, with shift select terminal 16="0", logic information shifts from right to left.

Shift register circuit 10 is designed to facilitate an "asynchronous set" operation which is one in which the output of each stage (i.e., the output of the slave portion of each stage) goes to a logic "1" independent of the state of the clock. For asynchronous set operation, set terminal 18="1", clear terminal 20=EPL terminal 22="0", shift select terminal 16 is a "1" or a "0". For the above conditions and with clock terminal 36="1", in stage 1, T19 and T17 are on and T14, T15, T16, and T18 are off. This keeps I2 from flowing through R2 and, accordingly, the potential of the base of T12 and, therefore, the emitters of T12 (the outputs of the slave of stage 1) are at a "1". In stage 2, T37 and T35 are on and T32, T33, T34, and T36 are off. This keeps I4 from flowing through R4 and, accordingly, the potential of the base of T30 and, therefore, the emitters of T30 (the outputs of the slave of stage 2) are at a high or "1" level.

If the clock is at a "0" level, then T18 is on and T19 is off. Output terminal 40 of the master of stage 1 now controls the output of the slave of stage 1. T6 and T7 are on and T3, T4, T5, and T8 are off. I1 flows through T6 and, therefore, does not flow through R1 and, accordingly, the potential of the base of T1 (terminal 38) is a "1" and, accordingly, the output terminal 40 is also a "1". Thus the output (terminal 58) of the slave is a "1" since it follows that of the output (terminal 40) of the master. Using the same basic analysis, it is clear that the master of slave 2 is likewise set to a "1" and that it then sets the state of the output of the slave of stage 2 to a "1".

Shift register circuit 10 is designed to facilitate an "asynchronous clear" operation which is one in which the output of each stage is set to a logic "0" independent of the state of the clock. For an asynchronous clear operation, clear terminal 20="1", set terminal 18=EPL terminal 22="0", shift select terminal 16 is either a "1" or "0". For clock terminal 36="1", T16 and T19 are on and T14, T15, T17, and T18 are off. This causes current to flow through R2 and T13 into T16 and T19. As a result, terminal 54 (the base of T12) assumes a low level, a "0", and, accordingly, the output terminals 52, 56, and 58 of T12 are set to "0s". Correspondingly, using the same analysis, it is clear that the outputs (terminals 94, 98, 100, and 44) of T30 are likewise at the "0" level.

If clock terminal 36 is now set to a "0", then T19 is off and T18 is on. For this condition, the output of the slave (terminals 52, 56, and 58) of stage 1 is the same as the output of the master (terminal 40) of stage 1. For these conditions, T3, T4, T6, and T8 are off and T7 and T5 are on. This causes a flow of current I1 though R1 which results in the base of T1 (terminal 38) being sent to a low level, a "0". Accordingly, output terminals 40 and 42 of T1 are set to "0s". Thus the output at terminals 52, 56, and 58 also assumes a "0". Correspondingly, using the same analysis of stage 1, it is clear that output terminals 44, 94, 98, and 100 of T30 of stage 2 likewise assume a low state for the above-stated conditions when clock terminal 36 is a "0".

Thus it has been demonstrated that with clear terminal 20="1" and set terminal 18=EPL terminal 22="0", that the outputs of the stages 1 and 2 assume a "0" state whether clock terminal 36 is at a "1" or "0". Shift register circuit 10 thus provides an asynchronous clear operation.

Shift register circuit 10, with optional transistors T15 and T33 utilized, is designed to facilitate an asynchronous parallel load operation in which each stage of the register is loaded simultaneously with data independent of all other stages of the register whether clock terminal 36 is a "1" or a "0". The EPL terminal 22 is used as an "enable parallel load" terminal. Data to be parallel loaded into circuit 10 is applied to parallel load terminals 46 and 48 of stage 1 and to parallel load terminals 88 and 90 of stage 2. For asynchronous parallel load operation, EPL terminal 22="1", clear terminal 20=set terminal 18="0", and shift register terminal 16 is either a "0" or a "1". For these conditions and with clock terminal 36="1", T19 and T15 are on and T14, T16, T17, and T18 are off. I2 can flow from the source (not illustrated) of data coupled to terminal 48 or can flow from VR4 through R2 and the collector and second emitter of T13. If the signal applied to terminal 48 is at a "1", then the conduction is from the source (not illustrated) coupled to terminal 48 through T15 and T19 and not from VR4 through R2 and T13. Terminal 54 is therefore at a "1" and, accordingly, output terminals 52, 56, and 58 are "1s". After output terminals 52, 56, and 58 are set to "1s", then EPL terminal 22 can be returned to a "0" and output terminals 52, 56, and 58 stay at "1s". If the data applied to terminal 48 is a "0" instead of a "1", then the second emitter-base junction of T13 is forward-biased and conduction occurs from VR4 through R2 and T13, which sets the potential of terminal 54 to a "0". This results in output terminals 52, 56, and 58 being set to "0s". If EPL terminal 22 now switches to a "0", output terminals 52, 56, and 58 each stay at a "0". It is noted that the state of the master of stage 1 has no effect on the output of the slave while the clock is at a "1". Output terminals 52, 56, and 58 assume a "1" if terminal 48 is held at a "1" and assume a "0" if terminal 48 is held at a "0".

The slave of stage 2 acts essentially identically to the slave of stage 1 in response to data entered on terminal 90.

Assume EPL terminal 22="1" and clock terminal 36=clear terminal 20=set terminal 18="0", and that shift select terminal 16 is a "1" or a "0". With respect to stage 1, T18 is on and T19 is off. Under these conditions, the state of the slave of stage 1 is controlled by the state of the master of stage 1. With respect to the master of stage 1, T4 and T7 are on and T8, T3, T5, and T6 are off. If the data applied to terminal 46 is a "1", then the third emitter-base junction of T2 is not sufficiently biased to allow conduction therethrough. There is no conduction through R1 and, therefore, terminal 38 and output terminal 40 are "1s". Output terminals 52, 56, and 58 of the slave of stage 1 are thus set to "1s". If the data applied to terminal 46 is a "0" instead of a "1", then the third emitter-base junction of T2 is sufficiently forward-biased to cause conduction therethrough which lowers the potential of terminal 38 to a "0". Output terminal 40 is thus also lowered to a "0". The slave of stage 1 is therefore also set to a "0" since one of its input terminals, terminal 40, is a "0" and clock terminal 36 is a "0". Thus, whether the clock is a "1" or a "0", output terminals 52, 56, and 58 of stage 1 assume the state of parallel load input terminals 46 and 48.

The master of stage 2 acts essentially identically to the master of stage 1 in response to data entered on terminal 88. Accordingly, the slave of stage 2 is set by the master of stage 2 to the same logic state as is applied to terminal 88 of the master when clock terminal 36="0" and EPL terminal 22="1".

It is thus illustrated that shift register circuit 10 does facilitate an asynchronous parallel load operation.

Shift register circuit 10 is designed, with the exclusion of T15 and T33, to facilitate a "synchronous parallel load" operation which is one in which each slave stage of circuit 10 is loaded simultaneously, when clock terminal 36 switches from a "1" to a "0", with data which is independent of all other stages. Typically, clock terminal 36 has applied thereto a periodic voltage pulse train which serves as a clock signal. Data information to be parallel loaded into shift register circuit 10 must be applied during specific portions of the clock signal. For synchronous parallel load operation, set terminal 18=clear terminal 20="0", and shift select terminal 16 is a "1" or a "0", and clock terminal 36 periodically switches between a "1" and a "0".

EPL terminal 22 is initially at a "0". Data is applied to parallel load terminals 46 and 88 of stages 1 and 2, respectively. At a point in time when clock terminal 36 is a "1", EPL terminal 22 is switched to a "1". With respect to stage 1, T8 is on and T7 is off with clock terminal 36 at "1". If EPL terminal 22 is a "0", then T4 is off. After EPL terminal 22 is switched to a "1", T4 becomes enabled (capable of conducting current) but still does not conduct since T7 is off. The data applied to terminal 46 is not entered into the master of stage 1 at this time since no current path exists from terminal 46 through T4 and T7 to terminal 70. EPL terminal 22 is held at a "1" while clock terminal 36 switches to a "0". This turns on T7 and thus allows conduction from terminal 46 through T4 and T7. If a "1" is applied to terminal 46, then T2 does not conduct and, consequently, terminal 38 is at a "1". This results in terminal 40 also being a "1". This "1" level appearing at terminal 40 causes output terminals 52, 56, and 58 of the slave of stage 1 to be set to "1s". Prior to the time clock terminal 36 again switches to a "1", EPL terminal 22 is switched to a "0". This turns off T4 and T3 turns on. This latches the master of stage 1 such that terminals 40 and 42 remain at the previously set logic state independent of the logic state of terminal 46.

If a "0" rather than a "1" was applied to terminal 46, then T2 conducts and the resulting current flow through R1 causes terminal 38 to be set to a "0". This results in terminal 40 being set to a "0" and thus causes output terminals 52, 56, and 58 of the slave of stage 1 to also be set to "0s".

Data information applied to parallel load terminal 88 of stage 2 is entered in the same manner as stage 1 to cause the entered data to appear at the output terminals 44, 94, 98, and 100 of stage 2.

It is thus clear that shift register circuit 10 is configured so as to facilitate a "synchronous load" operation.

A 4-bit shift register circuit was integrated on a single integrated circuit chip with transistors T15 and T33 utilized and with transistors T2 and T21 being four-emitter n-p-n transistors and was found to be fully functional. In this register, $R1=R2=R3=R4=400$ ohms and $I1=I2=I3=I4=200\times10^{-6}$ amperes. A level shifter circuit comprising an emitter function transistor with an emitter resistor was utilized as a level shifter with its output terminal coupled to clock terminal 36. The use of this level shifter permitted the potential levels of the clock signal to be at the same levels as were utilized for the data, set, clear, and EPL input terminals.

Figure 2:
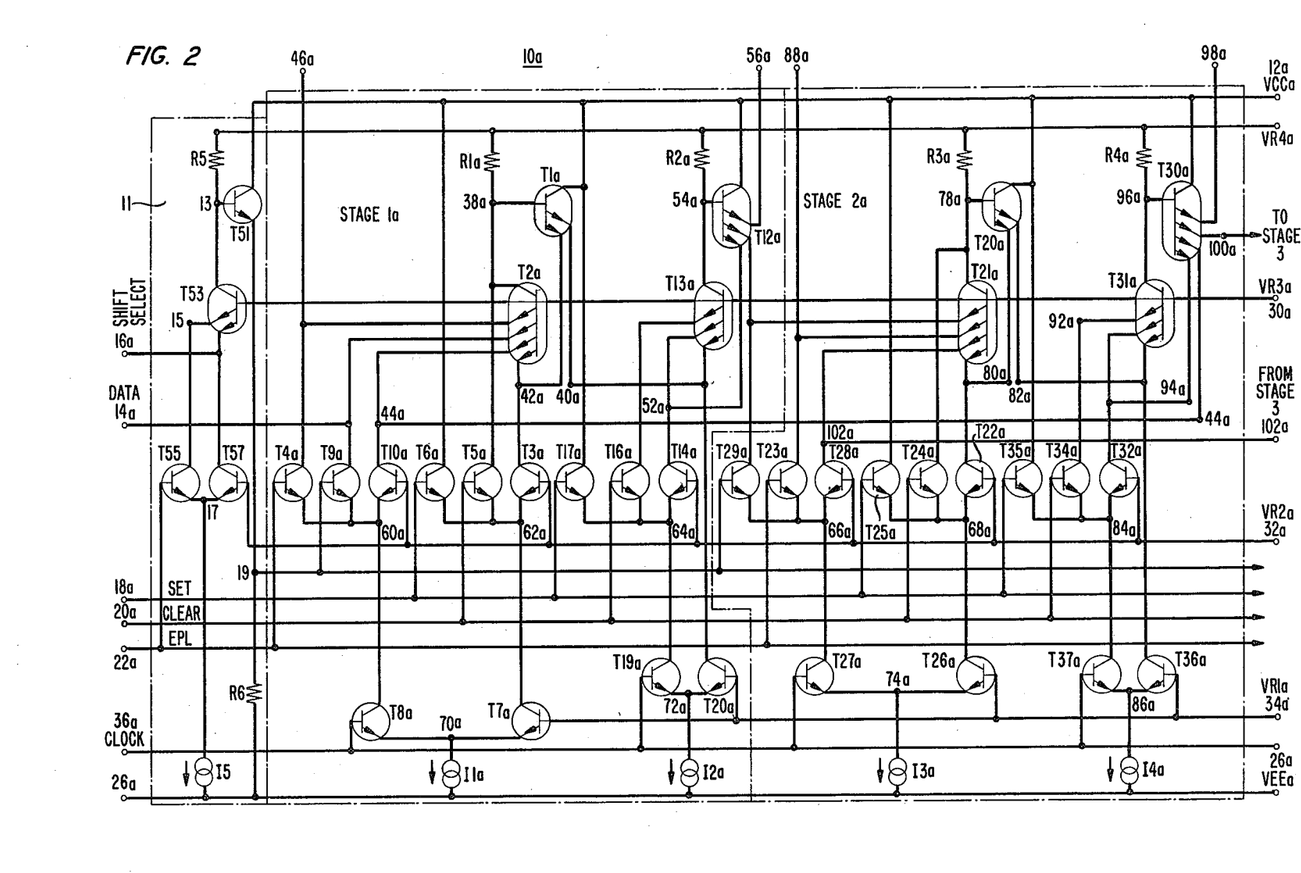
FIG. 2 illustrates another embodiment of a shift register circuit in accordance with the invention.

Referring now to FIG. 2, there is illustrated a shift register circuit 10a which comprises first and second circuit stages, stage 1a and stage 2a (illustrated within dashed line rectangles), and a control circuit 11 (illustrated within a dashed line rectangle). Each stage comprises a D-type master-slave flip-flop implemented in emitter function-type logic (EFL). Control circuit 11 is an EFL-type circuit which is designed to provide an output "0" when an EPL input signal is a "1" and to provide an output signal of the same logic state as is applied to shift select terminal 16a when EPL input terminal is a "0". Circuit 10a is very similar to circuit 10 of FIG. 1 and it operates in essentially the same manner except for the synchronous load and shift select operations. Components and terminals of circuit 10a which are essentially the same as the corresponding components and terminals of circuit 10 of FIG. 1 have the same numerical reference number with an "a" added to the end of the number.

Control circuit 11 essentially comprises n-p-n transistors T51, T53, T55, and T57, resistors R5 and R6, and essentially constant current source I5. T53 is a dual emitter transistor. An enable parallel load terminal 22a is coupled to the base of T55 of control circuit 11 and a shift select terminal 16a is coupled to the second emitter of T53 and to the collector of T57. The emitters of T55 and T57 are coupled together to one terminal of I5 and to a terminal 17. A second terminal of I5 is coupled to a terminal 26a and a power supply VEEa. The collector of T55 is coupled to the first emitter of T53 and to a terminal 15. The base of T57 is coupled to a reference source VR2a and to a terminal 32a. The base of T53 is coupled to a terminal 30a and to a reference voltage supply VR3a. The collector of T53 is coupled to the base of T51, a first terminal of R5 and to a terminal 13. A second terminal of R5 is coupled to a terminal 12a and to a voltage supply VCCa. The emitter of T51 is coupled to the bases of n-p-n transistors T9a and T29a of stage 1a and stage 2a, respectively, a first terminal of R6, and to output terminal 19 of control circuit 11. A second terminal of R6 is coupled to a terminal 26a and to a power supply VEEa.

With EPL terminal 22a at a "0", T55 is off and T57 is on. If terminal 16a is a "0", then the second emitter-base junction of T53 becomes forward-biased sufficiently to allow I5 to flow from VR4a through R5, T53, and T57. This conduction through R5 sets the potential of terminal 13 to a "0". Accordingly, output terminal 19 is set to a "0". This sets T9a and T29a of stages 1a and 2a, respectively, to an off state. This disables data from the master of stages 1a and 2a at terminals 14a and 58a, respectively. Data from output terminal 44a of stage 2a therefore controls the master of stage 1a and output data from terminal 102a of stage 3a (not illustrated) controls the master of stage 2a. When clock terminal 36a goes from a "1" to a "0", the outputs of the masters are latched and the respective slaves assume the logic state at the output of the master coupled thereto. Thus for the above-stated conditions, data is shifted from left to right, from stage 3a (not illustrated) to stage 2a and from stage 2a to stage 1a.

In order to shift data from right to left, i.e., from stage 1a to stage 2a and from stage 2a to stage 3a (not illustrated), shift select terminal 16a="1" and EPL terminal 22a=clear terminal 20a=set terminal 18a="0", and clock terminal 36a ="1". T55 is off and T57 is on. I5 flows from a data shift select circuit (not illustrated) coupled to terminal 16a and then through T57. Since terminal 16a is a "1", the second emitter-base junction of T53 is biased so as to not allow conduction therethrough. Thus the voltage of terminal 13 is at a high level (close to that of VR4) and, accordingly, output terminal 19 is set to a "1". This turns T9a and T29a of stages 1a and 2a, respectively, on. Accordingly, data at terminals 14a and 58a controls the masters of stages 1a and 2a. When clock terminal 36a then thereafter goes to a "0", the outputs of the masters of stages 1a and 2a are latched and the respective slaves assume the logic state at the output of the master coupled thereto. Thus, data is shifted from left to right [from stage 1a to stage 2a and from stage 2a to stage 3a (not illustrated)].

With EPL terminal 22a="1", then T55 is on and T57 is off. I5 flows from VR4a through R5, T53, and T55. This sets terminal 13 to a low level [a voltage drop (I5R5) below the potential of VR4a] and results in terminal 19 being set to a "0". This biases T9a and T29a off. With clock terminal 36a at a "1", T8a and T19a of stage 1a are on and T27a and T37a of stage 2a are on. Data applied to parallel load terminals 46a and 88a of stages 1a and 2a, respectively, thereby controls the outputs of the masters of stages 1a and 2a, respectively. When clock terminal 36a is then thereafter switched to a "0", the output terminals 40a, 42, 80a, and 82a of the masters of stages 1a and 2a, respectively, are latched to the stages that existed when clock terminal 36a="1".

These prior existing states are the same as were applied to the respective data loading terminals 46a and 88a. In addition, the slaves then switch to the same state as the master coupled thereto. Thus, the output of each stage (the output terminals of the slave of each stage) is set to the same logic state as is applied to parallel loading terminals 46a and 88a. One advantage of circuit 10a is that data from the parallel loading terminals is entered into the masters when clock terminal 36a is a "1", and when clock terminal 36a is switched to a "0", the output of the masters are latched such that if data on terminals 46a and 88a changes, or is subject to noise caused variations, there is no change of the state of the masters. Thus, the slaves are set to the desired states and there is no change in the state of the slaves if the data on terminals 46a and 88a changes.

Figure 3:
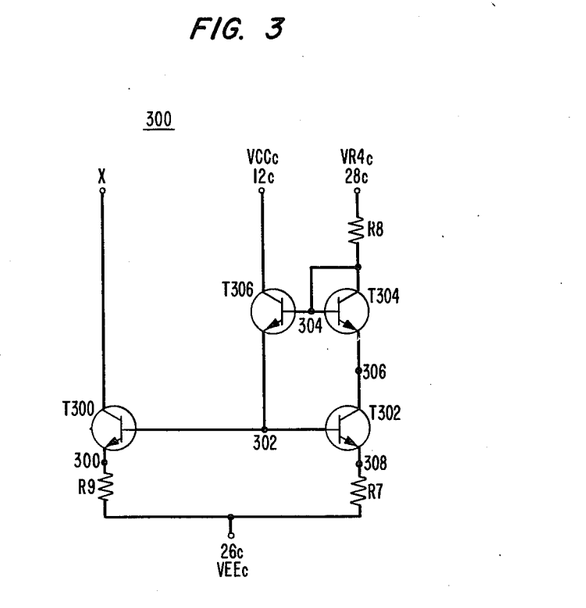
FIG. 3 illustrates a constant current source which can be used with the shift register circuits of FIGS. 1 and 2.

Now referring to FIG. 3, there is illustrated an essentially constant current source 300 which comprises n-p-n transistors T300, T302, T304, and T306, and resistors R7, R8, and R9. A terminal "x" is coupled to the collector of T300. Terminal "x" may be any of terminals 70, 72, 74, and 86 of FIG. 1 or terminals 17, 70a, 72a, 74, and 86a of FIG. 2. The emitter of T300 is coupled to one terminal of R9 and to a terminal 300. The second terminal of R9 is coupled to a second terminal of R7, a terminal 26c, and power supply VEEc. The bases of T300 and T302 are coupled together to the emitter of T306 and to a terminal 302. The collector of T306 is coupled to a terminal 12c and to a power supply VCCc. The bases of T306 and T304 are coupled to the collector of T304, to a first terminal of R8, and to a terminal 304. A second terminal of R8 is coupled to a terminal 28c and to a reference voltage source VR4c. The emitter of T304 is coupled to the collector of T302 and to a terminal 306. The emitter of T302 is coupled to a first terminal of R7 and to a terminal 308.

Circuit 300 functions as an essentially constant current source in that changes in potential at terminal "x" have essentially no effect on the current that passes through T300 and R9. R8, T302, T304, and T306 act essentially as a current mirror-type configuration which result in the current flow through R7 being essentially the same as the current flow through R9, provided R9 and R7 have the same ohmic value. T306 serves to provide base drive to T300. This base drive to T300 comes to a substantial degree from the VCCc supply and not from the VR4c supply. Consequently, the current through R9 is more closely identical to that through R7 then is the case with more simplified current mirror-type circuits. One combination of T302, T304, and T306 and R7 and R8 is in a preferred embodiment coupled to the bases of a number of transistors like T300 which each have a separate resistor R9 coupled to the emitter thereof. The "x" terminal collector of each of these transistors (T300) serves as the first terminal of a current source. The configuration of FIG. 3 is the preferred embodiment of the constant current sources illustrated in FIGS. 1 and 2.

It is to be understood that the specific embodiments of the invention described herein are merely illustrative of the general principles of the invention. Various modifications are feasible consistent with the spirit of the invention. For example, p-n-p transistors, field effect transistors, or other types of switching devices, which each have a control terminal and output terminals, can be substituted for the n-p-n transistors provided the magnitudes and polarities of the power supplies are appropriately changed. Still further, some of the control functions and the corresponding transistors which facilitate same may be eliminated in some applications. For example, T14, T15, T16, T32, T33, T34, and T35 of FIG. 1 could be eliminated provided the collector of T19 is coupled to terminal 52 and the collector of T37 is coupled to terminal 94. Still further, the collectors of transistors connected to VCC or VCCa of FIGS. 1 and 2, respectively, could be connected to VR4 and VR4a, respectively, to eliminate a VCC or VCCa bus to the circuits. This would increase current and current transients on VR4 and VR4a. VR4 and VR4a could both be eliminated by connecting to VCC and VCCa all terminals which were connected to VR4 and VR4a, respectively. This eliminates the need for VR4 and VR4a but allows logic levels to vary with VCC or VCCa.

I claim:

1. A shift register circuit comprising:
a plurality of cascaded stages;
each stage having a master circuit having input and output terminals and comprising an EFL-type master storage cell and first, second, and third master control circuit means for selectively controlling an output terminal of the master circuit;
each stage further having a slave circuit having input and output terminals and comprising an EFL-type slave storage cell and a first slave control circuit means for selectively controlling an output terminal of the slave circuit;
an output terminal of a master circuit is coupled to an input terminal of a slave circuit;
an output terminal of each slave circuit serving as an output terminal of that stage and being coupled to an input terminal of a subsequent stage, if a subsequent stage exists, and to an input terminal of a preceding stage, if a preceding stage exists;
first and second output terminals of the first master control circuit means are coupled to a first output terminal of the second master control circuit means and to a first output terminal of the third master control circuit means, respectively;
a second output terminal of the second master control circuit means is coupled to the master storage cell;
a second output terminal of the third master control circuit means is coupled to the master storage cell; and
first and second output terminals of the first slave control circuit means are coupled to the slave storage cell.

2. The circuit of claim 1 further comprising a second slave control circuit means for selectively controlling the output of the slave circuit, said second slave control circuit means being coupled by a first output terminal to a first output terminal of the first slave control circuit means and being coupled by a second output terminal to the slave storage cell.

3. The circuit of claim 2 wherein:
the master storage cell comprises a first resistor (R1) and first and second switching devices (SD1, SD2);
the slave storage cell comprises a second resistor (R2) and third and fourth switching devices (SD3, SD4);
the first master control circuit means comprises a first essentially constant current source (I1) and a first differential amplifier which has fifth and sixth switching devices (SD5, SD6);
the second master control circuit means comprises a second differential amplifier which has seventh and eighth switching devices (SD7, SD8);
the third master control circuit means comprises a third differential amplifier which has ninth and tenth switching devices (SD9, SD10);
the first slave control circuit means comprises a second essentially constant current source (I2) and a fourth differential amplifier which has eleventh and twelfth switching devices (SD11, SD12);
the second slave control circuit means comprises a fifth differential amplifier which has thirteenth and fourteenth switching devices (SD13, SD14);
each of the first, second, third, fourth, fifth, sixth, seventh, eighth, ninth, tenth, eleventh, twelfth, thirteenth, and fourteenth switching devices has a control terminal and multiple output terminals;
R1 is coupled to the control terminal of SD1 and to a first output terminal of SD2;
first output terminals of SD5 and SD6 are coupled to I1;
a second output terminal of SD5 is coupled to first output terminals of SD7 and SD8;
a second output terminal of SD6 is coupled to first output terminals of SD9 and SD10;
a second output terminal of SD9 is coupled to a first output terminal of SD1 and to a second output terminal of SD2;
a second output terminal of SD7 is coupled to a third output terminal of SD2;
R2 is coupled to the control terminal of SD3 and to a first output terminal of SD4;
first output terminals of SD11 and SD12 are coupled to I2;
a second output SD11 is coupled to first output terminals of SD13 and SD14;
a second output terminal of SD12 is coupled to a second output terminal of SD4;
a second output terminal of SD13 is coupled to a third output terminal of SD4 and to a first output terminal of SD3; and
a second output terminal of SD1 is coupled to the second output terminal of SD4.

4. The circuit of claim 3 wherein SD1, SD2, SD3, SD4, SD5, SD6, SD7, SD8, SD9, SD10, SD11, SD12, SD13 and SD14 are n-p-n transistors and the first, second, third, fourth, and fifth differential amplifiers are emitter-coupled differential amplifiers.

5. A circuit comprising:
a master circuit having an EFL-type master storage cell having a plurality of control terminals and output terminals, first, second, and third master control circuit means for selectively controlling an output terminal of the master circuit;
a slave circuit having an EFL-type slave storage cell having a plurality of control terminals and output terminals, and a first slave control circuit means for selectively controlling an output terminal of the slave circuit;
a circuit input terminal coupled to the master circuit and a circuit output terminal coupled to the slave circuit;
first and second output terminals of the first master control circuit means are coupled to a first output terminal of the second master control circuit means and to a first output terminal of the third master control circuit means, respectively;
a second output terminal of the second master control circuit means is coupled to the master storage cell;
a second output terminal of the third master control circuit means is coupled to the master storage cell;

first and second output terminals of the first slave control circuit means are coupled to the slave storage cell, respectively; and an output terminal of the master circuit being coupled to an input terminal of the slave circuit.

6. The circuit of claim 5 further comprising:
a second slave control circuit means for selectively controlling an output of the slave circuit, and being coupled by a first output terminal to a first output terminal of the first slave control circuit means and being coupled by a second output terminal thereof to the slave storage cell.

7. The circuit of claim 6 wherein:
the master storage cell comprises a first resistor (R1) and first and second switching devices (SD1, SD2);
the slave storage cell comprises a second resistor (R2) and third and fourth switching devices (SD3, SD4);
the first master control circuit means comprises a first essentially constant current source (I1) and a first differential amplifier which has fifth and sixth switching devices (SD5, SD6);
the second master control circuit means comprises a second differential amplifier which has seventh and eighth switching devices (SD7, SD8);
the third master control circuit means comprises a third differential amplifier which has ninth and tenth switching devices (SD9, SD10);
the first slave control circuit means comprises a second essentially constant current source (I2) and a fourth differential amplifier which has eleventh and twelfth switching devices (SD11, SD12);
the second slave control circuit means comprises a fifth differential amplifier which has thirteenth and fourteenth switching devices (SD13, SD14);
each of the first, second, third, fourth, fifth, sixth, seventh, eighth, ninth, tenth, eleventh, twelfth, thirteenth, and fourteenth switching devices has a control terminal and multiple output terminals;
R1 being coupled to the control terminal of SD1 and to a first output terminal of SD2;
first output terminals of SD5 and SD6 are coupled to I1;
a second output terminal of SD5 is coupled to first output terminals of SD7 and SD8;
a second output terminal of SD6 is coupled to first output terminals of SD9 and SD10;
a second output terminal of SD9 is coupled to a first output terminal of SD1 and to a second output terminal of SD2;
a second output terminal of SD7 is coupled to a third output terminal of SD2;
R2 is coupled to the control terminal of SD3 and to a first output terminal of SD4;
first output terminals of SD11 and SD12 are coupled to I2;
a second output SD11 is coupled to the first output terminals of SD13 and SD14;
a second output terminal of SD12 is coupled to a second output terminal of SD4;
a second output terminal of SD13 is coupled to a third output terminal of SD4; and
a second output terminal of SD1 is coupled to the second output terminal of SD4.

8. The circuit of claim 7 wherein SD1, SD2, SD3, SD4, SD5, SD6, SD7, SD8, SD9, SD10, SD11, SD12, SD13, and SD14 are n-p-n transistors and the first, second, third, fourth, and fifth differential amplifiers are emitter-coupled differential amplifiers.

9. A circuit comprising:
an EFL-type storage cell having a plurality of control terminals and an output terminal;
first, second, and third control circuit means each having input terminals which serve as circuit input terminals and having output terminals;
the first control circuit means having a first output terminal coupled to a first output terminal of the second control circuit means and having a second output terminal coupled to a first output terminal of the third control circuit means;
a second output terminal of the second control circuit means being coupled to the storage cell; and
a second output terminal of the third control circuit means being coupled to the storage cell.

10. The circuit of claim 9 wherein:
the storage cell comprises a resistor (R1), a multiple emitter first junction transistor (SD1), and a multiple emitter second junction transistor (SD2);
the first control circuit means comprises an essentially constant current source (I1) and a first emitter-coupled pair of transistors (SD5, SD6);
the second control circuit means comprises a second emitter-coupled pair of transistors (SD7, SD8);
the third control circuit means comprises a third emitter-coupled pair of transistors (SD9, SD10);
R1 is coupled to the base of SD1 and to the collector of SD2;
a first emitter of SD1 is coupled to a first emitter of SD2 and to the collector of SD9;
a second emitter of SD2 is coupled to the collector of SD7;
the emitters of SD7 and SD8 are coupled to the collector of SD5, and the emitters of SD9 and SD10 are coupled to the collector of SD6; and
the emitters of SD5 and SD6 are coupled to I1.

11. The shift register circuit comprising:
a plurality of cascaded stages;
each stage having a master portion comprising first (T20) and second (T21) multi-emitter bipolar transistors, a first resistor (R3), a first emitter-coupled differential amplifier having two bipolar transistors (T28, T29), a second emitter-coupled differential amplifier having four bipolar transistors (T22, T23, T24, T25), a third emitter-coupled differential amplifier having two bipolar transistors (T26, T27), and a first essentially constant current source (I3);
each stage also having a slave portion comprising third and fourth multi-emitter bipolar transistors (T30, T31), a second resistor (R4), emitter-coupled differential amplifier having four bipolar transistors (T32, T33, T34, T35), a fifth emitter-coupled differential amplifier having two bipolar transistors (T36, T37), and a second essentially constant current source (I4);
R3 being coupled to the base of T20 and to the collector of T21;
a first emitter of T20 being coupled to a first emitter of T21 and to the collector of T22;
the second emitter of T21 being coupled to the collector of T23 and to a parallel load terminal 88;
the collector of T24 being coupled to a third emitter of T21 or to the base of T20;
the collectors of T20 and T25 being connectible to a first power supply VCC or to a first voltage reference source VR4;

one terminal of R3 is connectible to VR4 or to VCC;
the collector of T28 being coupled to a fourth emitter of T21 and to a terminal 102 which may be coupled to a subsequent stage, if, in fact, a subsequent stage exists;
the collector of T29 being coupled to a fifth emitter of T21 and to a terminal 58 which may be coupled to a preceding stage, if, in fact, there is a preceding stage;
the emitters of T28 and T29 being coupled to the collector of T27, and the emitters of T22, T23, T24, and T25 being coupled to the collector of T26;
the emitters of T26 and T27 being coupled together to one terminal of I3 which has a second terminal which is connectible to a second power supply VEE;
R4 being coupled to the base of T30 and to the collector of T31;
a first emitter of T30 being coupled to a first output terminal 98, a second emitter of T30 being coupled to a second output terminal 100, a third emitter of T30 being coupled to data input terminal 44 of a preceding stage, if, in fact, there is a preceding stage, and a fourth emitter of T30 being coupled to a second emitter of T31 and to the collector of T32;
a first emitter of T31 being coupled to the first emitter of T20 and to the collector of T36;
a third emitter of T31 being coupled to the collector of T33 and to a parallel load terminal 90;
a fourth emitter of T31 being coupled to the collector of T34;
the emitters of T32, T33, T34, and T35 being coupled to the collector of T37;
the emitters of T36 and T37 being coupled to one terminal of I4 which has a second terminal which is connectible to VEE;
the bases of T21 and T31 being coupled to a reference voltage source VR3, the bases of T22, T28, and T32 being coupled to a reference voltage source VR2, and the bases of T26 and T36 being coupled to a reference voltage source VR1;
the base of T29 being coupled to a shift select terminal 16;
the bases of T25 and T35 being coupled to a set terminal 18;
the bases of T24 and T34 being coupled to a clear terminal 20;
the bases of T23 and T33 being coupled to an enable parallel load (EPL) terminal 22;
the bases of T27 and T37 being coupled to a clock terminal 36;
the collectors of T30 and T35 being connectible to VCC or to VR4; and
R4 being adapted to be coupled to VR4 or VCC.

12. A shift register circuit comprising:
a control circuit comprising a first emitter-coupled differential amplifier having two bipolar transistors (T55, T57), a third transistor T51, a fourth dual emitter transistor 53, resistors R5 and R6, and an essentially constant current source I5;
one terminal of R5 is connectible to a voltage reference source VR4a or to a power supply VCCa;
the collector of T51 is connectible to VCCa or to VR4a;
a second terminal of R5 is coupled to the base of T51 and to the collector of T53;
a first emitter of T53 is coupled to the collector of T55, and a second emitter of T53 is coupled to the collector of T57 and to a shift select terminal;
the emitters of T55 and T57 are coupled to one terminal of I5;
a second terminal of I5 is connectible to a power supply VEEa;
the emitter of T51 is coupled to one terminal of R6 and to an output terminal of the control circuit;
a second terminal of R6 is connectible to VEEa; the base of T53 is coupled to a reference supply source VR3a;
the base of T57 is coupled to a voltage reference source VR2c; the base of T55 is coupled to an enable parallel load terminal;
a plurality of cascaded stages;
each stage having a master portion comprising first (T20a) and second (T21a) multi-emitter bipolar transistors, a third resistor (R3a), a second emitter-coupled differential amplifier having three bipolar transistors (T29a, T23a, T28a), a third emitter-coupled differential amplifier having three bipolar transistors (T22a, T24a, T25a), a fourth emitter-coupled differential amplifier having two bipolar transistors (T26a, T27a), and a second essentially constant current source (I3a);
each stage also having a slave portion comprising fifteenth and sixteenth multi-emitter bipolar transistors (T30a, T31a), a fourth resistor (R4a), a fifth emitter-coupled differential amplifier having three bipolar transistors (T32a, T34a, and T35a), a sixth emitter-coupled differential amplifier having two bipolar transistors (T36a, T37a), and a third essentially constant current source (I4a);
one terminal of R3a being coupled to the base of T20a and to the collectors of T21a and T24a;
a first emitter of T20a being coupled to a first emitter of T21a and to the collector of T22a;
a second emitter of T21a being coupled to the collector of T28a and to the output terminal of a subsequent stage, if, in fact, a subsequent stage exists;
a third emitter of T21a being coupled to the collector of T23a and to a parallel load terminal 88a;
the collectors of T20a, T25a, T30a, and T35a being connectible to a power supply VCCa or to a voltage reference source VR4a;
the emitters of T22a, T24a, and T25a being coupled to the collector of T26a;
the emitters of T23a, T28a, and T29a being coupled to the collector of T27a;
the emitters of T26a and T27a being coupled together to a first terminal of I3a, which is connectible by a second terminal thereof to a power supply VEEa;
R4a having one terminal coupled to the base of T30a and to the collector of T31a;
second terminals of R4a and R3a being connectible to a voltage reference source VR4a or to a power supply VCCa;
the bases of T21a and T31a being connectible to a second voltage reference source VR3a;
a first emitter of T30a being coupled to a second emitter of T31a and to the collector of T32a;
a second emitter of T30a being coupled to an input terminal of a preceding stage, if, in fact, such a preceding stage is utilized;
a third emitter of T30a being coupled to an input of a subsequent stage, if, in fact, such a subsequent stage is utilized;

a fourth emitter of T30a being coupled to an output terminal 98a of the stage;
a first emitter of T31a being coupled to a first emitter of T20a and to the collector of T36a;
a third emitter of T31a being coupled to the collector of T34a;
the emitters of T32a, T34a, and T35a being coupled to the collector of T37a;
the emitters of T36a and T37a being coupled to a first terminal of I4a, which has a second terminal that is connectible to a power supply VEEa;
the bases of T27a and T37a being coupled together to a clock terminal 36a;
the bases of T26a and T36a being coupled together to a voltage reference source VR1a;
the base of T29a being coupled to the emitter of T51;
the base of T23a being coupled to an enable parallel load (EPL) terminal 22a;
the bases of T22a, T28a, and T32a being coupled to a voltage reference source VR2a;
the bases of T25a and T35a being coupled to a set terminal 18a; and
the bases of T24a and T34a being coupled to a clear terminal 20a.

* * * * *

UNITED STATES PATENT AND TRADEMARK OFFICE
CERTIFICATE OF CORRECTION

PATENT NO. : 4,386,282

DATED : May 31, 1983

INVENTOR(S) : Robert J. Scavuzzo

It is certified that error appears in the above—identified patent and that said Letters Patent is hereby corrected as shown below:

Column 8, line 6, "slave 2" should be --stage 2--.
Column 10, line 34, "400 ohms" should be --4000 ohms--.
Column 11, line 68, "stages" should be --states--.
Column 16, line 39, "The" should be --A--.

Signed and Sealed this

Sixteenth Day of August 1983

[SEAL]

Attest:

GERALD J. MOSSINGHOFF

Attesting Officer    Commissioner of Patents and Trademarks